(12) United States Patent
Tran

(10) Patent No.: US 7,379,374 B2
(45) Date of Patent: May 27, 2008

(54) VIRTUAL GROUND CIRCUIT FOR REDUCING SRAM STANDBY POWER

(75) Inventor: Hiep V. Tran, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/511,159

(22) Filed: Aug. 28, 2006

(65) Prior Publication Data
US 2006/0291296 A1    Dec. 28, 2006

(51) Int. Cl.
G11C 11/00    (2006.01)
(52) U.S. Cl. .................. 365/230.03; 365/226
(58) Field of Classification Search .......... 365/230.03, 365/226
See application file for complete search history.

(56) References Cited
U.S. PATENT DOCUMENTS

| 5,610,723 A | * | 3/1997 | Yamagishi | 386/75 |
| 5,644,576 A | * | 7/1997 | Bauchot et al. | 370/437 |
| 5,689,470 A | * | 11/1997 | Inoue | 365/203 |

OTHER PUBLICATIONS

Wei et al., "Design and Optimization of Low Voltage High Performance Dual Threshold CMOS Circuits," 35th Design Automation Conference Proc., 489-494 (1998).
Powell et al., "Gated-Vdd: A Circuit Technique to Reduce Leakage in Deep-Submicron Cache Memories," Proc. Int. Symp. Low Power Electronics and Design (ISLPED), 90-95 (2000).
Agarawal et al., "A Single-Vt Low-Leakage Gated-Ground Cache for Deep Submicron," IEEE J. Solid-State Circuits, vol. 38, No. 2, 319-328 (Feb. 2003).

* cited by examiner

Primary Examiner—Michael T Tran
(74) Attorney, Agent, or Firm—Dolly Y. Wu; W. James Brady; Frederick J. Telecky, Jr.

(57) ABSTRACT

A method of operating a memory circuit having a plurality of blocks of memory cells (400-404) is disclosed. The method includes storing data in the plurality of blocks of memory cells. A first block of memory cells (400) is selected in response to a first address signal ($RA_{Y0}$). A row of memory cells (430-436) in the first block of memory cells is selected in response to a second address signal ($RA_{X0}$). A first voltage is applied to a first power supply terminal (412) of the first block of memory cells in response to the first address signal. A second voltage different from the first voltage is applied to a first power supply terminal (412) of another block of memory cells (402) of the plurality of blocks of memory cells. Data is retained in the other block of memory cells.

22 Claims, 4 Drawing Sheets

VIRTUAL GROUND CIRCUIT FOR REDUCING SRAM STANDBY POWER

FIELD OF THE INVENTION

This invention generally relates to electronic circuits, and more specifically to power reduction in semiconductor integrated circuits.

BACKGROUND OF THE INVENTION

The continuing popularity of portable electronic devices presents manufacturers with contrary goals. Battery capacity is dependent upon battery size and weight. Thus portable electronic devices could be made to operate a longer time between battery changes or recharging if these devices included heavier batteries with greater capacity. On the other hand, portable electronic devices would be more popular and more widely used if they were lighter. However, lighter weight translates into reduced battery capacity and reduced operating times. A large reduction in size of wireless telephones has taken place without significant reduction in operating times. While improvements in batteries have increased their capacity per unit weight, most of the improvement in operating time and reduction in device weight has come from improvements in the power consumption of the electronics. Many improvements have taken place in integrated circuit manufacture that have reduced the amount of power consumed by the electronics. Additional improvements have taken place by selective powering of portions of the electronics. To a large degree much of the advantage of selectively powering a microcontroller unit or a digital signal processor have already been realized by current state of the art devices. Thus manufacturers seek additional areas for power consumption reduction.

This additional area may be either a cache or main memory. Many portable electronic devices include substantial amounts of memory. Power savings may be gained by reducing leakage current in either nonvolatile or volatile memory in respective active and standby operating modes. Wei et al., "Design and Optimization of Low Voltage High Performance Dual Threshold CMOS Circuits," 35th Design Automation Conference Proc., 489-494 (1998) disclose a circuit and method for reducing leakage current using a dual threshold voltage process. This dual threshold voltage, however, requires a separate process step and may slow normal circuit operation. Powell et al., "Gated-Vdd: A Circuit Technique to Reduce Leakage in Deep-Submicron Cache Memories," Proc. Int. Symp. Low Power Electronics and Design (ISLPED), 90-95 (2000) disclose a dynamically resizable instruction (DRI) cache wherein a gated-ground nMOS transistor turns off unused portions of the instruction cache after application requirements are identified. Agarawal et al., "A Single-Vt Low-Leakage Gated-Ground Cache for Deep Submicron," IEEE J. Solid-State Circuits, vol. 38, no. 2, 319-328 (February 2003) disclose a data retention gated-ground cache (DRG cache) that turns off the cache during standby mode to conserve power. However, significant array noise may be generated when these rows of memory cells are restored to active mode. Moreover, initial access time may be reduced while full power is restored. The process of fully powering these memory circuits typically requires much more time than that required for a memory access in the fully powered state. Thus, memory access time from a low power or standby state includes both the time required to power up the memory circuit and the normal access time. However, access times of these memories remains important, so it may not be feasible to completely shut the memory down to conserve power.

SUMMARY OF THE INVENTION

In accordance with a preferred embodiment of the invention, there is disclosed a method of operating a memory circuit having a plurality of blocks of memory cells. Data are stored in the plurality of blocks of memory cells. A first block of memory cells is selected in response to a first address signal. A row of memory cells in the first block of memory cells is selected in response to a second address signal. A first voltage is applied to a first power supply terminal of the first block of memory cells in response to the first address signal. A second voltage different from the first voltage is applied to the first power supply terminal of another block of memory cells of the plurality of blocks of memory cells in response to the first address signal. Data is retained in unselected blocks of memory cells.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 1:
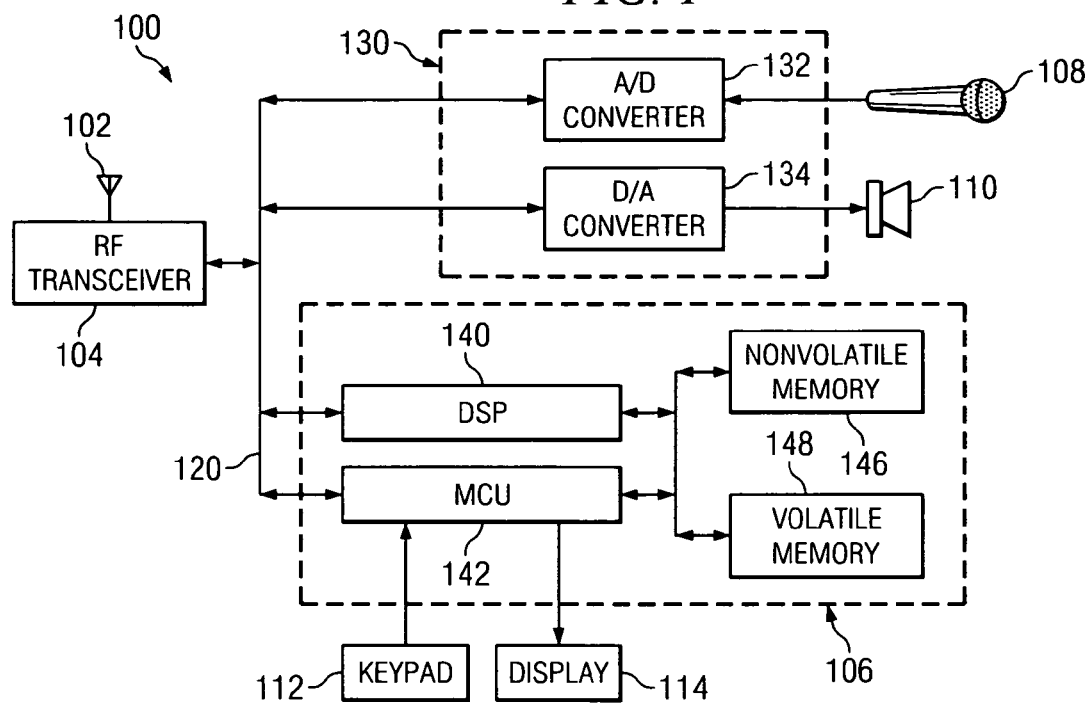
FIG. 1 is a block diagram of a wireless telephone which is an example of a portable electronic device which may advantageously employ the present invention.

Referring to FIG. 1, there is a block diagram of a wireless telephone as an example of a portable electronic device which could advantageously employ this invention. Wireless telephone 100 includes antenna 102, radio frequency transceiver 104, baseband circuits 106, microphone 108, speaker 110, keypad 112, and display 114. The wireless telephone is preferably powered by a rechargeable battery (not shown) as is well known in the art. Antenna 102 permits wireless telephone 100 to interact with the radio frequency environment for wireless telephony in a manner known in the art. Radio frequency transceiver 104 both transmits and receives radio frequency signals via antenna 102. The transmitted signals are modulated by the voice/data output signals received from baseband circuits 106 on bus 120. The received signals are demodulated and supplied to baseband circuits 106 as voice/data input signals on bus 120. An analog section 130 includes an analog to digital converter 132 connected to microphone 108 to receive analog voice signals. The analog to digital converter 132 converts these analog voice signals to digital data and applies them to digital signal processor 140 via bus 120. Analog section 130 also includes a digital to analog converter 134 connected to speaker 110. Speaker 110 provides the voice output to the user. Digital section 106 is embodied in one or more integrated circuits and includes a microcontroller unit 142, a digital signal processor 140, nonvolatile memory circuit 146, and volatile memory circuit 148. Nonvolatile memory circuit 146 may include read only memory (ROM), ferroelectric memory (FeRAM), FLASH memory, or other nonvolatile memory as known in the art. Volatile memory circuit 148 may include dynamic random access memory (DRAM), static random access memory (SRAM), or other volatile memory circuits as known in the art. Microcontroller unit 142 interacts with keypad 112 to receive telephone number inputs and control inputs from the user. Microcontroller unit 142 supplies the drive function to display 114 to display numbers dialed, the current state of the telephone such as battery life remaining, and received alphanumeric messages. Digital signal processor 140 provides real time signal processing for transmit encoding, receive decoding, error detection and correction, echo cancellation, voice band filtering, etc. Both microcontroller unit 142 and digital signal processor 140 interface with nonvolatile memory circuit 146 via bus 144 for program instructions and user profile data. Microcontroller unit 142 and digital signal processor 140 also interface with volatile memory circuit 148 via bus 144 for signal processing, voice recognition processing, and other applications.

Figure 2:
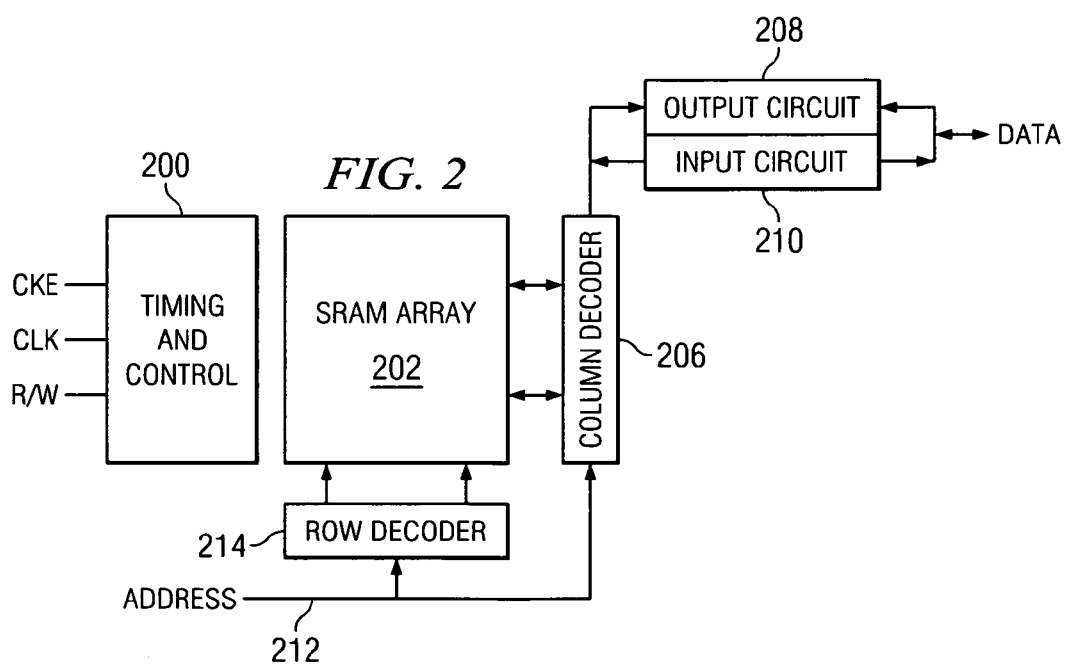
FIG. 2 is a block diagram of a static random access memory (SRAM) as may be used in the volatile memory circuit 148 of FIG. 1.

Referring to FIG. 2, there is a block diagram of a static random access memory circuit as may be used in the volatile memory circuit 148 of FIG. 1. The static random access memory circuit includes a timing and control circuit 200 coupled to receive a clock enable signal CKE, a system clock signal CLK, and a read/write signal R/W. During a standby mode of operation, clock enable signal CKE is at a logic low level. During an active mode of operation, clock enable signal CKE is at a logic high level. The static random access memory circuit of the present invention advantageously makes a transition from a standby mode to an active mode without generating significant array noise and without significant first access time penalty as will be explained in detail.

In active mode, the timing and control circuit 200 generates internal control signals (not shown) to control read and write operations of the static random access memory. An address applied to bus 212 includes row and column address bits. The row address bits are applied to row decoder circuit 214. The column address bits are applied to column decoder circuit 206. The row decoder circuit activates a wordline in response to the row address bits, thereby selecting a row of memory cells from the static random access memory array 202. The column decoder circuit 206 selects a column of memory cells in response to the column address bits on bus 212. A memory cell at the intersection of the selected row and column produces data to output circuit 208 during a read operation. Alternatively, the memory cell at the intersection of the selected row and column receives data from input circuit 210 during a write operation.

Figure 3:
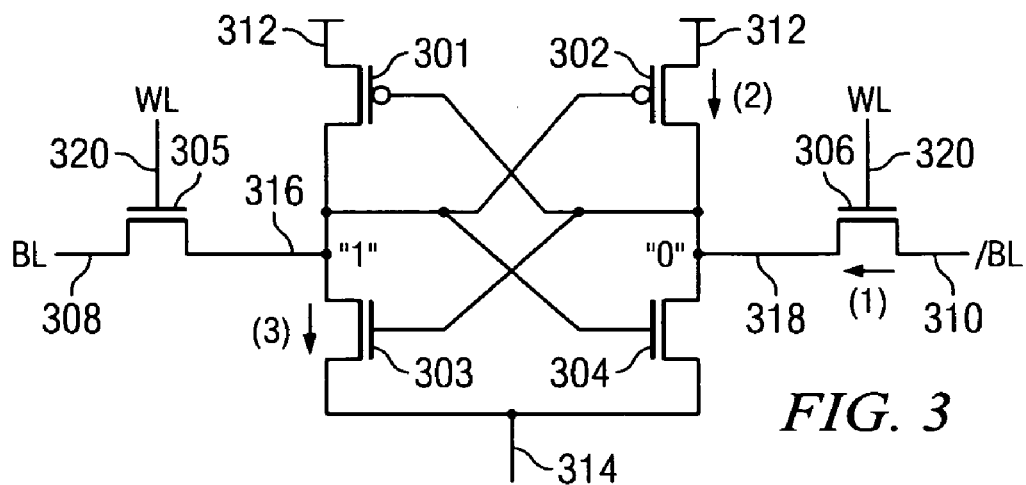
FIG. 3 is a schematic diagram of a 6-T static random access memory cell as may be used in the SRAM of FIG. 2.

Turning now to FIG. 3, there is a schematic diagram of memory cell as may be used in the SRAM array 202 of FIG. 2. The memory cell includes a latch formed by P-channel transistors 301 and 302 and N-channel transistors 303 and 304. P-channel transistor 301 is connected to N-channel transistor 303 to form a first inverting circuit having an output at terminal 316 and having an input at terminal 318. Likewise, P-channel transistor 302 is connected to N-channel transistor 304 to form a second inverting circuit having an output at terminal 318 and having an input at terminal 316. Each of the first and second inverting circuits, therefore, has an output connected to the input of the other inverting circuit to retain data in a latched state as long as power is applied to the memory cell. The source terminals of P-channel transistors 301 and 302 are connected to a power supply terminal which is preferably a positive Vdd or Varray power supply voltage. The source terminals of N-channel transistors 303 and 304 are connected to virtual ground terminal 314. The memory cell also includes N-channel access transistors 305 and 306. The current path of N-channel transistor 305 is coupled between bitline BL 308 and output terminal 316. The current path of N-channel transistor 306 is coupled between complementary bitline/BL 310 and output terminal 318. Control gates of N-channel transistors 305 and 306 are connected to wordline WL 320. By convention, all memory cells coupled to a common wordline form a row of memory cells. Likewise, all memory cells coupled to common bitlines and complementary bitlines form a column of memory cells.

In active mode, virtual ground terminal 314 is connected to a reference power supply terminal by a virtual ground switch for memory read or write operations as will be discussed in detail. This reference power supply terminal is preferably Vss or ground. Bitline BL and complementary bitline/BL are initially precharged to a logic high level, and wordline WL is at a low logic level. Data is stored in the latch portion of the memory cell such that one transistor of each inverter is on while the other is off. For example, if the memory cell stores a logical one, output terminal 316 produces a high logic level "1" and output terminal 318 produces a low logic level "0". For this data state, therefore, P-channel transistor 301 is on, and N-channel 303 is off. P-channel transistor 302 is off, and N-channel transistor 304 is on. Even when off, however, these transistors conduct significant subthreshold leakage current under weak inversion. N-channel transistor 306 and P-channel transistor 302 comprise parallel subthreshold conduction paths (1) and (2) to output terminal 318. N-channel transistor 303 comprises another subthreshold conduction path (3) to virtual ground terminal 314. Subthreshold leakage current is dominated by diffusion current rather than drift current. Thus, it is a strong function of a difference between gate-to-source voltage Vgs and threshold voltage Vt of a transistor. As a result, subthreshold current decreases exponentially as Vgs falls below Vt. The present invention advantageously minimizes this subthreshold leakage current during active mode by selectively activating virtual ground switches for those memory cells where read or write operations are possible. Other virtual ground switches remain off, thereby reducing subthreshold leakage current.

Moreover, in a standby mode, all virtual ground switches are off, thereby greatly reducing standby power of the memory circuit. In this mode, voltage at virtual ground terminal 314 is approximately a threshold voltage above reference power supply voltage Vss or ground. This increase in voltage at the virtual ground terminal produces a corresponding increase in voltage at output terminals 316 and 318. The precise voltage at virtual ground terminal is not critical. Referring back to the previous example, it is important that the voltage at output terminal 316 is an N-channel Vt above the voltage at virtual ground terminal 314 so that N-channel transistor 304 remains on. It is also important that the voltage at output terminal 318 is a P-channel Vt below power supply voltage Vdd 312 so that P-channel transistor 301 remains on. Thus, data stored in the memory cell is maintained when the respective virtual ground switch is off. The voltage increase at virtual ground terminal 314 increases the body effect and corresponding transistor threshold voltage Vt of N-channel transistor 303. The corresponding voltage increase at output terminal 318 increases the body effect and corresponding transistor threshold voltage Vt of N-channel transistor 306. Both effects increase Vt and reduce Vgs-Vt and subthreshold current through N-channel transistors 303 and 306, respectively. The increase in voltage at output terminal 316 directly decreases Vgs-Vt of P-channel transistor 302, thereby reducing subthreshold current.

Figure 4:
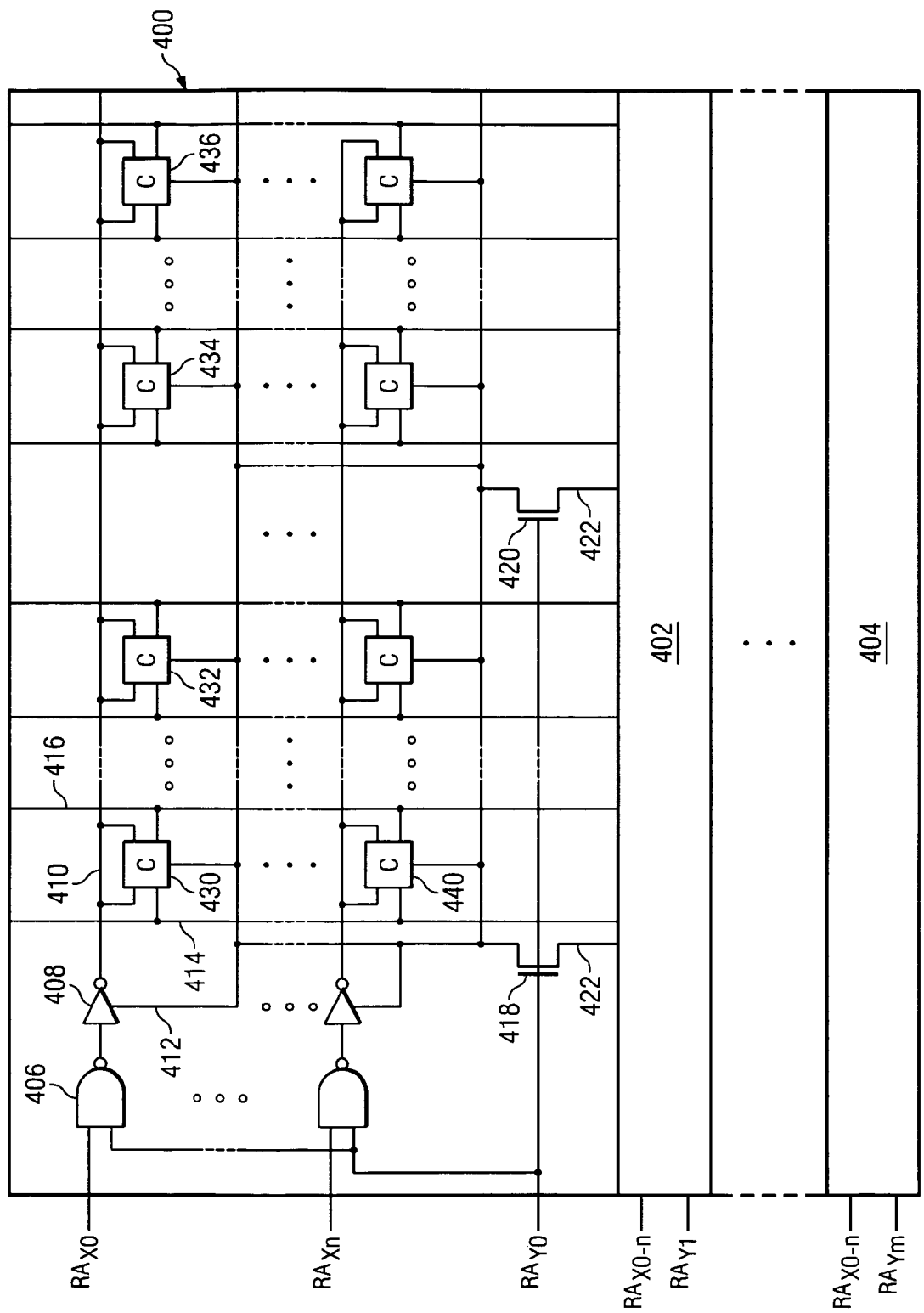
FIG. 4 is a schematic diagram of an embodiment of the present invention of SRAM array 202 of FIG. 2 having a virtual ground switch selected according to a predecoded block address.

Turning now to FIG. 4, there is a static random access memory array of the present invention. The memory array includes m+1 memory blocks 400, 402, and 404, where m is a positive integer. Each memory block is selected by a respective predecoded address signal $RA_{Y0}$, $RA_{Y1}$, and $RA_{Ym}$. Each of the memory blocks includes n+1 rows of memory cells and corresponding row decode circuits, where n is a positive integer. For example, memory block 400 includes a row decode circuit formed by NAND gate 406 and inverter 408. NAND gate 406 receives address signal $RA_{x0}$ to specifically select wordline 410. Address signal $RA_{x0}$ is preferably a group of least significant row address bits. NAND gate 406 also receives address signal $RA_{Y0}$ which is preferably a group of most significant row address bits. Taken together, address signals $RA_{X0}$ and $RA_{Y0}$ select memory block 400 and wordline 410. The memory cells of each block are arranged in columns. For example, memory cells 430 and 440 are arranged in a column connected to bitlines 414 and 416. A virtual ground terminal 412 is common to all memory cells in memory block 400 such as memory cells 430-436 in a first row and memory cell 440 in a second row. All of the blocks of memory cells share reference voltage supply lines 422, which are preferably distributed through the memory array. The virtual ground terminal 412 is selectively connected to these reference voltage supply lines in an active mode by a virtual ground switch formed by transistors 418 and 420. These virtual ground switch transistors 418 and 420 are selectively enabled by address signal $RA_{Y0}$ when memory block 400 is enabled in an active mode. Respective virtual ground switches of other unselected memory blocks 402 and 404 remain off in response to their respective predecoded address signals $RA_{Y1}$, and $RA_{Ym}$.

In operation, the memory circuit is initially in standby mode and all wordlines of each memory block are at a logic low level. All virtual ground switches are off in response to respective predecoded address signals $RA_{Y0-m}$. In this mode, the voltage at respective virtual ground terminals of each memory block, such as terminal 412, increases to approximately a threshold voltage positive with respect to reference voltage Vss or ground 422. This increase results from a ratio of memory cell subthreshold leakage to virtual ground subthreshold leakage within each respective memory block. The virtual ground switch subthreshold leakage is preferably greater than or equal to the memory cell subthreshold, so that a saturation voltage at virtual ground terminal 412 is less than one-half of power supply voltage Vdd. This increased voltage advantageously decreases standby power of the memory circuit as previously discussed.

Upon a transition to active mode such as a read or write operation, address signals $RA_{X0-n}$ and $RA_{Y0}$, for example, are applied to the row decode circuits of block 400. The common virtual ground terminal of memory block 400 is quickly discharged to reference voltage Vss. Virtual ground terminals of other unselected memory blocks 402-404 remain at their saturation voltages. A product of the discharge current of block 400 and metal resistance induces a brief voltage spike on the power supply reference voltage lines 422. Such a voltage spike is often referred to as array noise and may capacitively couple to signal lines such as adjacent bitlines and create a data error. The present invention, however, advantageously minimizes the magnitude of this voltage spike by activating only one of the memory blocks corresponding to a respective predecoded address signal. Moreover, due to the relatively small magnitude of the voltage spike, no significant time delay is required before a read operation of a selected memory cell may be performed.

Figure 5:
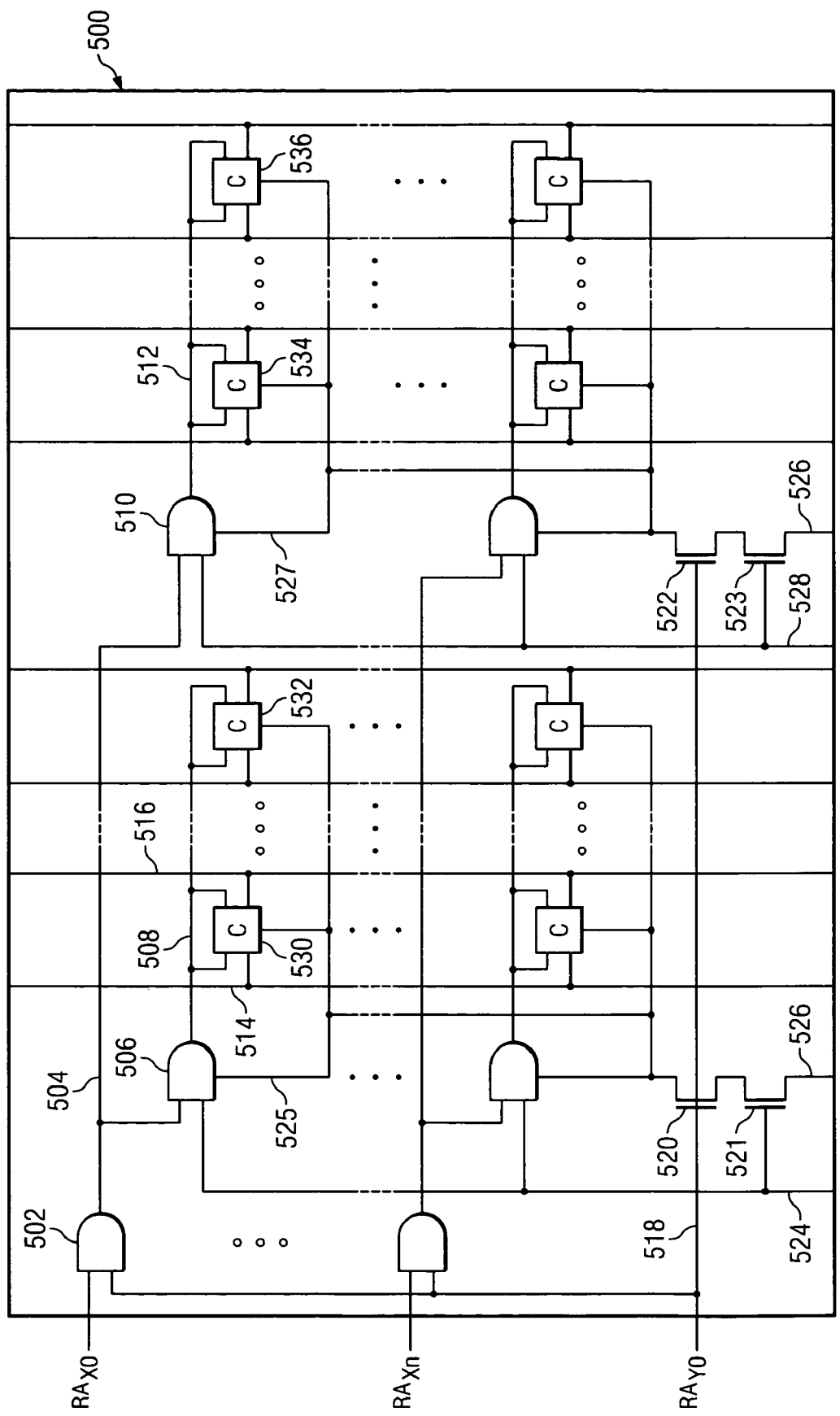
FIG. 5 is a schematic diagram of another embodiment of the present invention of SRAM array 202 of FIG. 2 having a virtual ground switch selected according to a predecoded block address and a row segment address.

Referring now to FIG. 5, there is a single memory block 500 showing another embodiment of the present invention. As with the example of FIG. 4, memory block 500 is preferably one of m memory blocks in a memory array. Memory block 500 includes n rows of segmented wordlines. Each segmented wordline includes a global wordline, for example, global wordline 504 and wordline segments 508 and 512. Memory block 500 is selected from a memory array by predecoded address signal $RA_{Y0}$. Global wordline 504, for example, is selected within memory block 500 by AND gate 502 in response to address signal $RA_{X0}$. As with block 400, $RA_{X0}$ and $RA_{Y0}$ are preferably least and most significant row address bits, respectively. A segment select signal on lead 524 or lead 528 selects one of wordline segments 508 and 512 by enabling one of AND gates 506 and 510. Data are transmitted to and from a memory cell such as memory cell 530 by bitlines 514 and 516. Memory cells corresponding to each group of wordline segments in memory block 500 include a respective virtual ground terminal. For example, memory cells 530 and 532 are connected to virtual ground terminal 525. Likewise, memory cells 534 and 536 are connected to virtual ground terminal 527. The virtual ground switches operate as previously described except that each virtual ground switch is enabled by both a predecoded block select address signal and a segment select signal. For example, N-channel transistors 520 and 521 form a virtual ground switch for virtual ground terminal 525. N-channel transistors 522 and 523 form a virtual ground switch for virtual ground terminal 527. Both virtual ground switches selectively connect their respective virtual ground terminals to reference power supply lines 526, which are common to all m memory blocks of the memory array.

In operation, all memory blocks are initially in standby mode as previously described with respect to FIG. 4. Upon a transition to active mode such as a read or write operation, address signal $RA_{X0}$ and $RA_{Y0}$, for example, are applied to AND gate 502 to select block 500 and global wordline 504. A segment select signal on lead 524 is applied to AND gate 506. Thus, wordline segment 508 goes to a high logic level while wordline segment 512 remains low. The common virtual ground terminal 525 of memory block 500 is quickly discharged to reference voltage Vss through transistors 520 and 521. Virtual ground terminals of unselected wordline segment groups and other memory blocks remain at their saturation voltages. A voltage spike induced by this discharge, however, is substantially less than that of FIG. 4, since a single wordline segment group shares all reference power supply lines 526. The embodiment of FIG. 5, therefore, provides a further reduction in array noise and improved first access time.

Figure 6A:
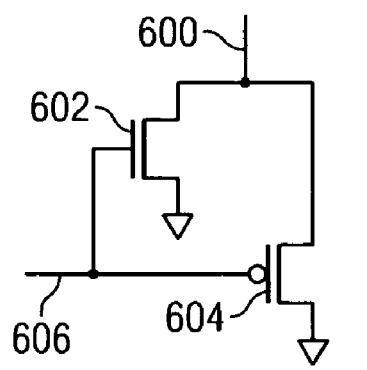
FIG. 6A is a second embodiment of a virtual ground switch according to the present invention.
Figure 6B:
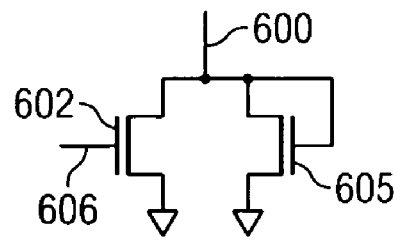
FIG. 6B is a third embodiment of a virtual ground switch according to the present invention.
Figure 6C:
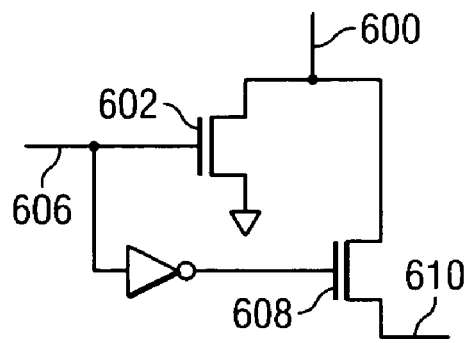
FIG. 6C is a fourth embodiment of a virtual ground switch according to the present invention.

Referring now to FIGS. 6A-6C, there are three alternative embodiments of virtual ground switches that may be used with the memory arrays of FIGS. 4 and 5. In each case, terminal 600 is the virtual ground terminal, N-channel transistor 602 connects the virtual ground terminal to reference voltage supply Vss, and a high logic level signal at terminal 606 selectively enables the virtual ground switch. In operation, the embodiment of FIG. 6A selectively connects virtual ground terminal 600 to reference voltage supply Vss through P-channel transistor 604 when the signal at terminal 606 is at a low logic level. Thus, the virtual ground terminal remains at a saturation voltage of approximately a P-channel threshold voltage positive with respect to reference voltage supply Vss. The embodiment of FIG. 6B connects virtual ground terminal 600 to reference voltage supply Vss through N-channel transistor 605 configured as a diode. Thus, the virtual ground terminal remains at a saturation voltage of approximately an N-channel threshold voltage Vt positive with respect to reference voltage supply Vss when the signal at terminal 606 is at a low logic level. Finally, in the embodiment of FIG. 6C the signal on lead 606 is inverted and applied to a control gate of N-channel transistor. Thus, N-channel transistor 608 selectively connects virtual ground terminal 600 to a reference voltage at lead 610 when a signal at lead 606 is low.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, advantages of the present invention might be realized by a virtual power supply line rather than a virtual ground line. Each switching circuit would be inserted between the Vdd or Varray power supply and a common source terminal of the P-channel transistors of the memory cell. Furthermore, application of the present invention is not strictly limited to memory cells. Advantages of the present invention might be realized by reducing subthreshold current through any transistor circuit such as inverter 408 (FIG. 4) during standby mode. In view of the foregoing discussion, it is intended that the appended claims encompass any such modifications or embodiments.

What is claimed is:

1. A method of operating a memory circuit, comprising the steps of:
   selecting a first block of memory cells in response to a first address signal;
   selecting a row of memory cells in the first block of memory cells in response to a second address signal;
   applying a first voltage to a first reference power supply ground terminal of the first block of memory cells in response to the first address signal;
   applying a second voltage different from the first voltage to a first reference power supply ground terminal of another block of memory cells of the plurality of blocks of memory cells in response to the first address; and
   using a virtual ground switch for the applying of the first voltage or the second voltage, and the virtual ground switch comprises two transistors operating together to set an output terminal of the virtual ground switch at a threshold voltage of a N-channel or P-channel transistor.

2. A method as in claim 1, further comprising a step of letting a virtual ground terminal of the first block of memory cells increase to a threshold voltage above the first voltage.

3. A method as in claim 1, comprising the steps of:
   unselecting the first block of memory cells in response to a control signal; and
   applying the second voltage to the first block of memory cells.

4. A method as in claim 1, wherein the second voltage is positive with respect to the first voltage.

5. A method as in claim 1, wherein the memory circuit is a static random access memory circuit.

6. A method as in claim 1, wherein the step of selecting a row of memory cells comprises selecting a segment of a global row of memory cells in response to a third address signal, and wherein the step of applying the second voltage comprises applying the second voltage in response to the first and third address signals.

7. A method as in claim 1, wherein the step of selecting a row of memory cells comprises applying the first voltage to a drive circuit in response to the second address signal.

8. A memory circuit, comprising:
   a memory array having a plurality of blocks of memory cells, each block having a respective plurality of rows of memory cells, each memory cell having a respective first power supply terminal;
   a first row dedode circuit coupled to the respective plurality of rows of memory cells of a first block of memory cells and coupled to receive a first address signal;
   a first switching circuit arranged to selectively connect the first power supply terminal of the respective plurality of rows of memory cells of the first block of memory cells to a second power supply terminal in response to the first address signal;
   a second row decode circuit coupled to the respective plurality of rows of memory cells of a second block of memory cells and coupled to receive a second address signal; and
   a second switching circuit arranged to selectively connect the first power supply terminal of the respective plurality of rows of memory cells of the second block of memory cells to the second power supply terminal in response to the second address signal.

9. A memory circuit as in claim 8, wherein the memory cells are static random access memory cells.

10. A memory circuit as in claim 8, wherein each of the first address signal corresponds to the first block of memory cells, and wherein the second address signal corresponds to the second block of memory cells.

11. A memory circuit as in claim 8, wherein each switching circuit comprises:
    a P-channel transistor having a current path connected between the first and second power supply terminals; and
    an N-channel transistor having a current path connected between the first and second power supply terminals.

12. A memory circuit as in claim 8, wherein each switching circuit comprises:
    a first N-channel transistor having a current path connected between the first and second power supply terminals; and
    a second N-channel transistor having a current path connected between the first and second power supply terminals and having a control gate connected to one end of the current path.

13. A memory circuit as in claim 8, wherein each switching circuit comprises:
- a first N-channel transistor having a current path connected between the first and second power supply terminals; and
- a second N-channel transistor having a current path connected between the first power supply terminal and a third power supply terminal.

14. A memory circuit as in claim 8, wherein each switching circuit comprises a plurality of transistors connected in parallel.

15. A memory circuit as in claim 8, wherein the memory cells comprises a latch and two access transistors, wherein the latch comprises two inverting circuits and the two inverting circuits are coupled together at a virtual ground terminal which is coupled to a virtual ground switch.

16. A method of operating an electronic device, comprising the steps of:
- selecting a first block of memory cells in response to a first address signal;
- selecting a row of memory cells in the first block of memory cells in response to a second address signal;
- applying a first voltage to a first reference power supply ground terminal of the first block of memory cells in response to the first address signal; and
- applying a second voltage different from the first voltage to a first reference power supply ground terminal of another block of memory cells of the plurality of blocks of memory cells in response to the first address; and
- using a virtual ground switch for the applying of the first voltage or the second voltage, and the virtual ground switch comprises two transistors operating together to set an output terminal of the virtual ground switch at a threshold voltage of a N-channel or P-channel transistor.

17. A method as in claim 16, comprising the steps of:
- unselecting the first block of memory cells in response to a control signal; and
- applying the second voltage to the first block of memory cells.

18. A method as in claim 16, wherein a difference between the first voltage and the second voltage is approximately equal to a transistor threshold voltage.

19. A method as in claim 16, wherein the step of selecting a row of memory cells comprises selecting a segment of a global row of memory cells in response to a third address signal, and wherein the step of applying the second voltage comprises applying the second voltage in response to the first and third address signals.

20. A method as in claim 16, wherein the step of selecting a row of memory cells comprises applying the first voltage to a drive circuit in response to the second address signal.

21. A method as in claim 16, wherein the electronic device is a portable electronic device.

22. A method as in claim 16, wherein the electronic device is a wireless telephone.

* * * * *